(12) United States Patent
Ito et al.

(10) Patent No.: US 6,541,308 B2
(45) Date of Patent: Apr. 1, 2003

(54) PROCESS FOR PRODUCING SEMICONDUCTOR PACKAGE AND STRUCTURE THEREOF

(75) Inventors: Mutsuyoshi Ito, Isikawa (JP); Kentaro Ohta, Ishikawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/387,836

(22) Filed: Sep. 1, 1999

(65) Prior Publication Data

US 2002/0001966 A1 Jan. 3, 2002

(30) Foreign Application Priority Data

Sep. 11, 1998 (JP) .......................................... 10-258369

(51) Int. Cl.⁷ ............................................. H01L 21/44
(52) U.S. Cl. ...................................................... 438/113
(58) Field of Search ............................... 438/113, 114, 438/458, 460–465

(56) References Cited

U.S. PATENT DOCUMENTS

| | | | | |
|---|---|---|---|---|
| 5,346,861 A | * | 9/1994 | Khandros et al. | 437/215 |
| 5,919,329 A | * | 7/1999 | Banks et al. | 156/281 |
| 5,950,070 A | * | 9/1999 | Razon et al. | 438/113 |
| 5,952,725 A | * | 9/1999 | Ball | 257/777 |
| 6,004,867 A | * | 12/1999 | Kim et al. | 438/459 |
| 6,163,956 A | * | 12/2000 | Corisis | 29/832 |
| 6,228,688 B1 | * | 5/2001 | Ohta et al. | 438/127 |
| 6,251,705 B1 | * | 6/2001 | Degani et al. | 438/108 |

FOREIGN PATENT DOCUMENTS

JP          9-232256          9/1997

* cited by examiner

Primary Examiner—David Nelms
Assistant Examiner—Quoc Hoang
(74) Attorney, Agent, or Firm—Bell, Boyd & Lloyd LLC

(57) ABSTRACT

A process for producing a semiconductor package and a structure thereof are provided in that yield per unit wafer is increased, yield and reliability are improved, and the number of production steps are decreased. The process includes the steps of a step of forming a bump on a semiconductor wafer for respective semiconductor chip constituting a semiconductor package; a step of dicing a substrate, which has been prepared, into a substrate piece corresponding to the respective semiconductor chip; a step of die-boding the substrate piece, which has been diced, on the semiconductor wafer with making the bump to correspond to the respective semiconductor chip; a step of sealing a gap between the semiconductor wafer and the substrate piece, which have been die-bonded, with a resin; and a step of dicing the semiconductor wafer and the substrate piece, which have been sealed with the resin, into the respective semiconductor package.

10 Claims, 6 Drawing Sheets

FIG.1A     FIG.1B
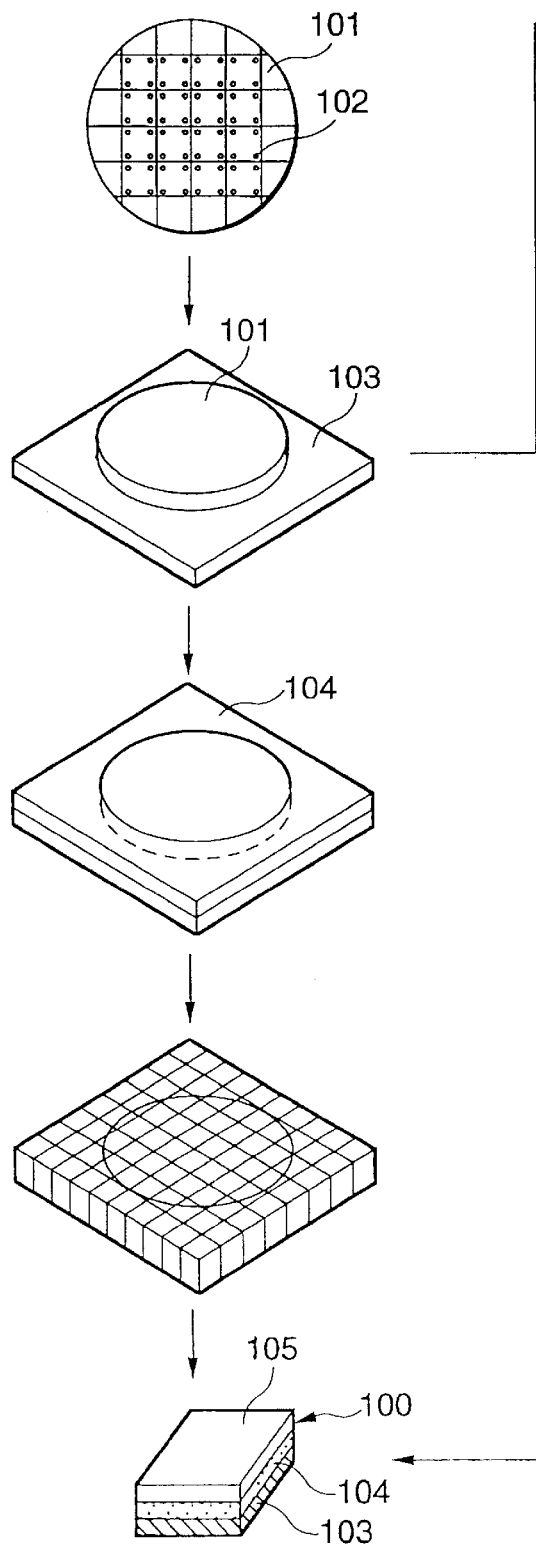
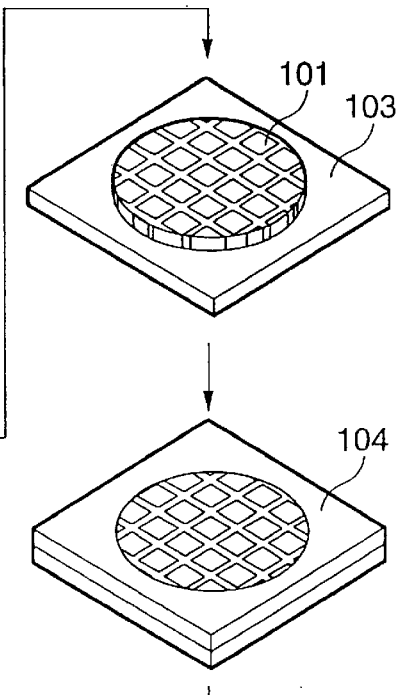
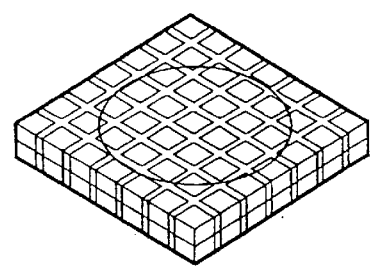

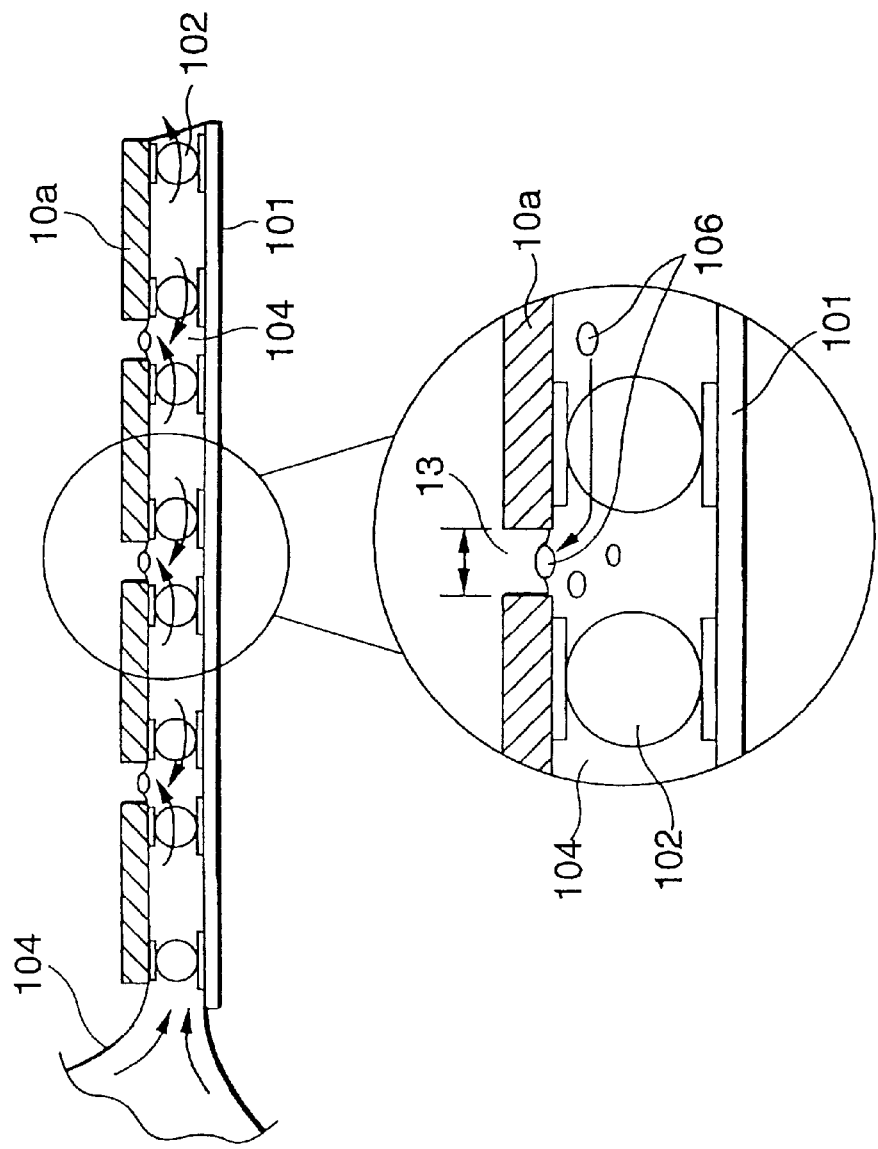

PROCESS FOR PRODUCING SEMICONDUCTOR PACKAGE AND STRUCTURE THEREOF

RELATED APPLICATION DATA

The present application claims priority to Japanese Application No. 10-258369 filed Sep. 11, 1998 which application is incorporated herein by reference to the extent permitted by law.

BACKGROUND OF THE INVENTION

1. Field of the Invention

The present invention relates to a process for producing a semiconductor package and a structure thereof, and particularly, it relates to a process for producing a semiconductor package suitable for a CSP and a structure thereof.

2. Description of the Related Art

In recent years, microminiaturization of a semiconductor package proceeds with miniaturization of an assembled apparatus, and a chip scale package or chip size package (referred to as CSP herein) using a bump connecting technique is developed.

FIGS. 1A and 1B are diagrams showing an example of a related art process for producing a CSP.

As shown in FIGS. 1A and 1B, a bump 102 is formed on a semiconductor wafer 101, which is then die-bonded on a substrate 103. The processing steps after the die bonding are classified into two processes, one of which is shown in FIG. 1A and the other is shown in FIG. 1B.

In the process shown in FIG. 1A, the assembly is sealed with a resin 104, and the wafer 101, the sealing resin 104 and the substrate 103 are subjected to dicing in one piece to complete a CSP 100. The CSP 100 has a layered structure comprising, from the upper side, a semiconductor chip 105, the sealing resin 104 and the substrate 103. (See, for example, Japanese Patent Laid-Open No. 232256/1997) In the process shown in FIG. 1B, only the wafer 101 die-bonded to the substrate 103 is subjected to dicing, and then sealed with a resin 104. The substrate sealed with the resin is then subjected to dicing to complete a CSP 100.

The process shown in FIG. 1A has the following problems:

(1) Since the substrate and the wafer in one piece are cut, the cutting must be conducted with a blade having a large thickness for cutting a substrate. Such a blade has a thickness of about 150 μm, which is three times or more than that of a blade for cutting a wafer, and therefore kerf loss becomes as large as three times or more.

(2) Since the cutting is conducted by using a blade for cutting a substrate under conditions for cutting a substrate, the semiconductor chip may chipped off.

(3) A flux cleaner and the sealing resin are difficult to penetrate into the inside, and a void (bubble) is difficult to escape (as shown in FIG. 2). Therefore, there is a possibility that on heating in a later step, the void expands to form a crack.

Specifically, in FIG. 2, the both surfaces of the assembly are surrounded by the wafer 101 and the substrate 103 and therefore, only a casting method is effective for sealing with resin 104, in which the resin 104 flows from an inlet 110 to an outlet 111 at an angle θ against the horizontal plane, followed by heating from the side of substrate 103. In this case, in an area where air is entrapped, or in the case where a gas is generated, a void 106 does not escape but remains, resulting in the formation of a crack.

(4) Conduction failure is easily caused by a great influence of warpage of the substrate (as shown in FIG. 3).

Specifically, in FIG. 3, a non-contact part 107 is formed due to a warpage W, resulting in conduction failure. Also, even when the contact is effected, a stress is generated at the bump 102 due to the warpage, resulting in conduction failure, too.

(5) When positional deviation occurs in a die bonding step, all products obtained from the sheet (the semiconductor wafer and the substrate) become defective articles.

The process shown in FIG. 1B has the following problems in addition to the problems (1) to (5):

(6) Since the wafer is fixed only with the bump upon dicing, a crack may be formed at the bump and the dicing contact part due to damage caused by dicing, and thus conduction failure may occur.

(7) The number of dicing steps is larger by once than the process of FIG. 1A.

SUMMARY OF THE INVENTION

An object of the invention is to provide a process for producing a semiconductor package and a structure thereof in that an yield per unit area of the wafer is increased, yield and reliability of the product are improved, and the number of processing steps is reduced.

In order to solve the problems described above, the invention relates to a process for producing a semiconductor package comprising a semiconductor chip, a sealing resin and a substrate, which comprises the steps of:

a step of forming a bump on a semiconductor wafer for respective semiconductor chip constituting the semiconductor package;

a step of dicing a substrate, which has been prepared, into a substrate piece corresponding to the respective semiconductor chip;

a step of die-boding the substrate piece, which has been diced, on the semiconductor wafer with making the bump to correspond to the respective semiconductor chip;

a step of sealing a gap between the semiconductor wafer and the substrate piece, which have been die-bonded, with a resin; and a step of dicing the semiconductor wafer and the substrate piece, which have been sealed with the resin, into the respective semiconductor package.

The invention also relates to a semiconductor package comprising a semiconductor chip constituting the semiconductor package, having equipped therewith a substrate through a bump, the substrate having a size smaller than the semiconductor chip.

According to the process of the invention, only the substrate is cut with a blade having a large thickness for cutting a substrate, and then the semiconductor wafer can be cut with a blade having a small thickness for cutting a wafer. Therefore, the yield of the semiconductor package (semiconductor chip) per unit area of the wafer is increased, and at the same time, chipping off of the semiconductor chip is prevented to increase the yield. Furthermore, since a void escapes from the gap among the substrate pieces on sealing with the resin to eliminate a remaining void, formation of a crack due to the remaining void can be suppressed to improve the reliability.

BRIEF DESCRIPTION OF THE DRAWINGS

FIGS. 1A and 1B are diagrams showing a related art process.

FIGS. 5A and 5B are diagrams showing a substrate piece in the embodiment of the invention, in which FIG. 5A is a plan view thereof, and FIG. 5B is a cross sectional view on line X—X.

FIG. 6 is a diagram including a partially enlarged view showing a function of the embodiment of the invention.

DESCRIPTION OF THE PREFERRED EMBODIMENTS

The invention is hereunder described with reference to the following embodiments shown in the figures. The parts having been described are shown with the same symbols, and the descriptions thereof are omitted.

Figure 5A:
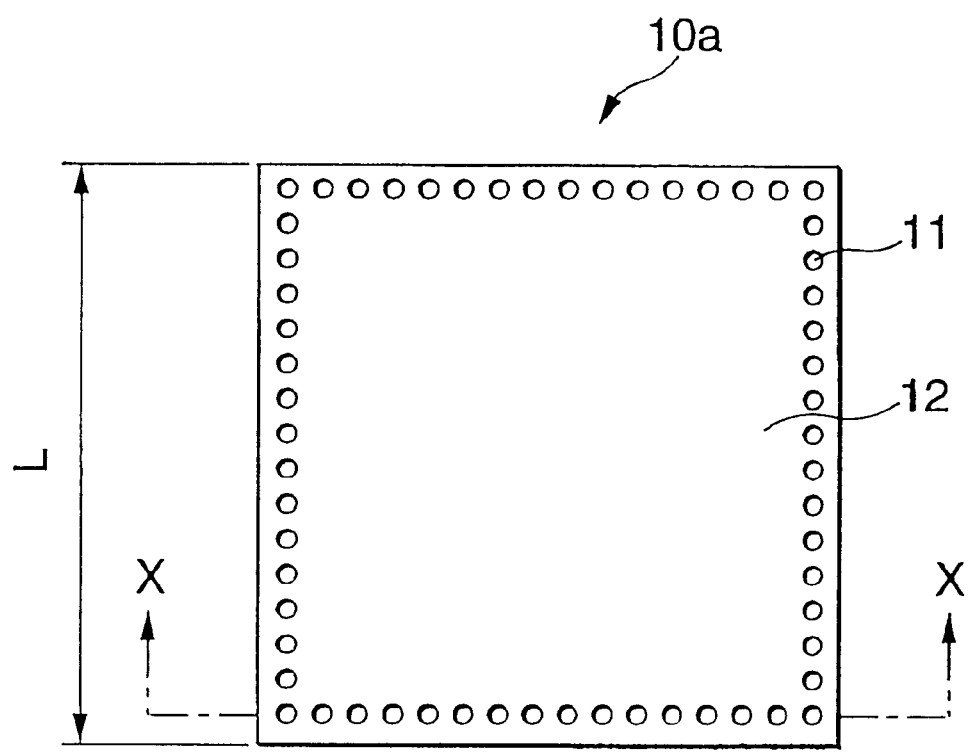
Figure 5B:
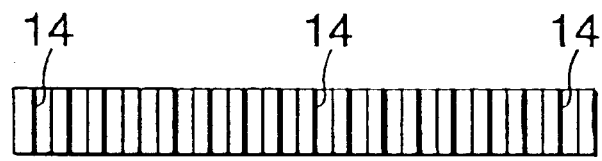

FIG. 1 is a diagram showing an embodiment of the production process of the invention; and FIGS. 5A and 5B are diagrams showing a substrate piece in the embodiment, in which FIG. 5A is a plan view thereof, and FIG. 5B is a cross sectional view on line X—X.

Figure 2:
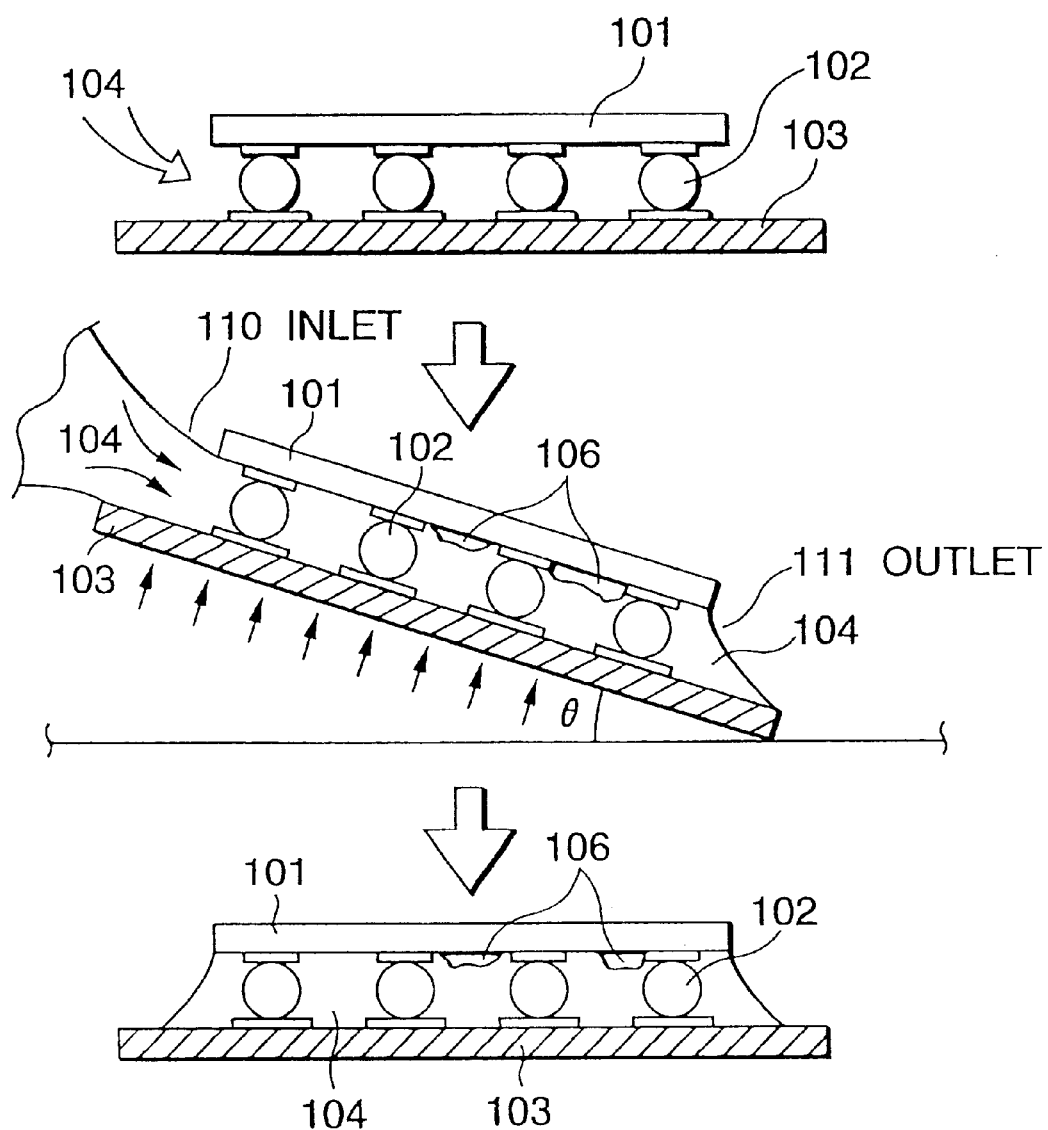
FIG. 2 is a diagram showing a problem associated with the related art process.
Figure 3:
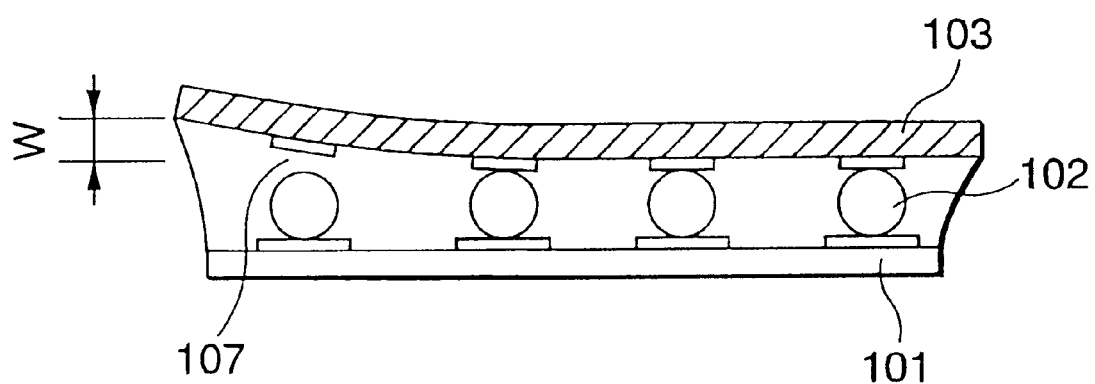
FIG. 3 is a diagram showing another problem associated with the related art process.
Figure 4:
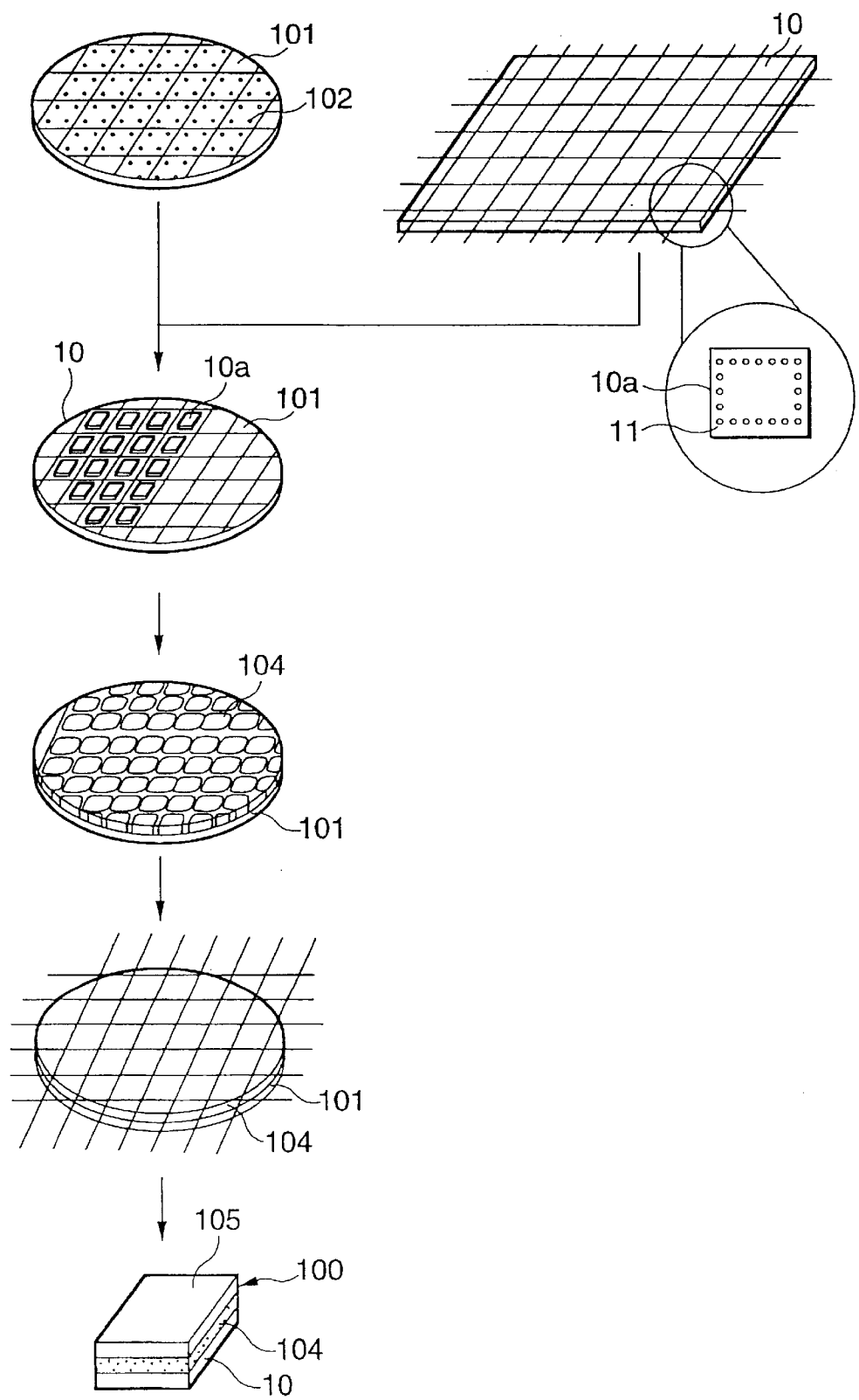
FIG. 4 is a diagram showing an embodiment of the invention.

As shown in FIGS. 4, 5A and 5B, after preparing a semiconductor wafer 101 and a substrate 10, a bump 102 is formed on a surface of the semiconductor wafer 101 so as to correspond to the respective semiconductor chip. Also, the substrate 10 is subjected to dicing to form substrate pieces 10a.

The substrate 10 is a double-sided substrate, in which through-holes 14 penetrate from a land 11 on the front surface to a land surface on the back surface, and an adhesive sheet not shown in the figures is attached to the bottom of the substrate 10. Therefore, a plurality of the substrate pieces 10a are not scattered on dicing. The size L of the substrate piece 10a after dicing is equivalent to or smaller than that of a semiconductor chip 105. The thickness of the substrate 10 is as thin as possible within the possible range ensuring the mechanical strength. Numeral 12 denotes a resist.

As a material of the substrate 10, for example, a glass-epoxy resin substrate, a paper-phenol resin substrate, a paper-epoxy resin substrate, and a ceramic substrate are suitable, and as a material of the semiconductor wafer 101, for example, a silicon substrate and a gallium-arsenic substrate are suitable.

The substrate 10 after dicing is placed on the semiconductor wafer 101, and then subjected to die bonding. Thereafter, the gap is sealed with a resin 104, as shown in FIG. 6.

At this time, because the substrate 10 has been cut to form a gap (clearance) 13 between the substrate pieces 10a, the resin 104 and a flux cleaner are easy to penetrate therein, and a void 106 migrates in an arrow direction and easily escapes, as shown in FIG. 6. That is, the gap 13 functions as an air outlet on the sealing with the resin 104, and thus, the resin 104 well penetrates. The void 106 can be forcedly eliminated by using a defoaming machine. Therefore, a remaining void can be eliminated, and formation of a crack on heating in the later step can be prevented. Furthermore, since the substrate 10 has been cut into the respective pieces, no warpage occurs on die bonding, and conduction failure due to warpage can be prevented. Still further, even when positional deviation occurs in one substrate piece, the positional deviation affects only the substrate piece (for example, only one substrate piece) but does not spread throughout the substrate attached with the adhesive sheet, and thus the yield is improved.

The semiconductor wafer 101 is then subjected to dicing. At this time, since the substrate 101 has been diced with a large-width blade for cutting a substrate, the semiconductor wafer is cut with a small-width blade for cutting a wafer. Therefore, the semiconductor wafer 101 is not chipped off.

A CSP 100 is completed by the process described above.

When the formation of the bump and the dicing of the substrate are simultaneously conducted in parallel in the process shown in FIG. 4, the period of time required for the processing can be reduced in comparison to the related art process. That is, while the formation of the bump and the dicing of the substrate have not been able to conduct simultaneously in the related art process, they can be simultaneously conducted in this embodiment of the invention as shown in FIG. 4, and thus the processing time can be shortened.

Furthermore, not only the specific substrate used in this embodiment shown in FIG. 5 having lands on the outer periphery but also a substrate of a related art type having a circuit pattern on the inside thereof may be used in the invention.

In the case of the specific substrate used in this embodiment, the thickness of the substrate can be as thin as possible within the possible range ensuring the mechanical strength owing to the simple structure thereof.

According to the invention described in the foregoing, because only the substrate has been cut with a large-width blade for cutting a substrate, and the semiconductor wafer has been cut with a blade having a small thickness for cutting a wafer, the yield of the semiconductor package (semiconductor chip) per unit area of the wafer is increased, and the semiconductor chip is not chipped off to improve the yield.

Because a void escapes from the gap among the substrate pieces on sealing with a resin, to eliminate a remaining void, formation of a crack caused by the remaining void can be suppressed to improve the reliability.

Furthermore, because it is possible to simultaneously conduct the formation of the bump and the dicing of the substrate, the processing time of the semiconductor package can be shortened.

What is claimed is:

1. A process for producing a semiconductor package comprising a semiconductor chip, a sealing resin and a substrate, which comprises the steps of:

a step of forming a bump on a semiconductor wafer for respective semiconductor chip constituting said semiconductor package;

a step of dicing a substrate, which has been prepared, into a substrate piece corresponding to said respective semiconductor chip;

a step of die-bonding said substrate piece, which has been diced, on said semiconductor wafer with making said bump to correspond to said respective semiconductor chip;

a step of sealing a gap between said semiconductor wafer and said substrate piece, which have been die-bonded, with a resin; and a step of dicing said semiconductor wafer and said substrate piece, which have been sealed with said resin, into said respective semiconductor package.

2. A process for producing the semiconductor package as claimed in claim 1, wherein said step of forming said bump on said semiconductor wafer and said step of dicing said substrate into a substrate piece are simultaneously conducted in parallel.

3. A process for producing the semiconductor package as claimed in claim 1, wherein said substrate piece is diced into a size smaller than a size of said semiconductor chip.

4. The method of claim 1, further comprising:
attaching an adhesive sheet to a first side of a substrate, wherein the plurality of substrate pieces are retained in place by the adhesive sheet during the cutting of the substrate.

5. The method of claim 4, wherein cutting the substrate into a plurality of substrate pieces includes using a blade having a first blade width, and cutting the resin and the semiconductor wafer includes using a blade having a second blade width, wherein the second blade width is less than the first blade width.

6. The method of claim 4, wherein sealing a space between the semiconductor wafer and the plurality of substrate pieces with a resin includes moving at least one void to a position below a kerf gap.

7. The method of claim 4, further comprising:
expelling the at least one void from the space through a kerf gap.

8. The method of claim 4, wherein moving at least one void to a position below a kerf gap includes using a defoaming machine.

9. The method of claim 4, wherein the substrate includes a circuit pattern.

10. The method of claim 9, further comprising:
expelling at least one void from a space through a kerf gap.

* * * * *